(12) United States Patent
Iorio et al.

(10) Patent No.: US 9,431,912 B2
(45) Date of Patent: Aug. 30, 2016

(54) CONTROL DEVICE FOR RECTIFIERS OF SWITCHING CONVERTERS

(71) Applicant: DORA S.p.A., Aosta (IT)

(72) Inventors: Alberto Iorio, Aosta (IT); Jeanpierre Vicquery, Aosta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 201 days.

(21) Appl. No.: 14/456,908

(22) Filed: Aug. 11, 2014

(65) Prior Publication Data

US 2015/0043249 A1 Feb. 12, 2015

(30) Foreign Application Priority Data

Aug. 12, 2013 (IT) .............................. MI2013A1384

(51) Int. Cl.
| | | |
|---|---|---|
| H02M 1/08 | (2006.01) | |
| H02M 3/335 | (2006.01) | |
| H03K 17/0412 | (2006.01) | |
| H03K 17/16 | (2006.01) | |
| H03K 17/13 | (2006.01) | |
| H03K 17/30 | (2006.01) | |
| H02M 7/217 | (2006.01) | |

(52) U.S. Cl.
CPC ... *H02M 3/33507* (2013.01); *H03K 17/04123* (2013.01); *H03K 17/133* (2013.01); *H03K 17/162* (2013.01); *H03K 17/302* (2013.01); *H03K 2017/307* (2013.01)

(58) Field of Classification Search
CPC ... H02M 1/08; H02M 1/217; H02M 3/33507
USPC .......................... 363/21.03, 21.06, 21.14, 89
See application file for complete search history.

(56) References Cited

U.S. PATENT DOCUMENTS

| | | | |
|---|---|---|---|
| 6,577,517 B2* | 6/2003 | Jain | .......................... H02M 1/38 363/127 |
| 2005/0134315 A1 | 6/2005 | Nakahara et al. | |
| 2011/0163800 A1 | 7/2011 | Soma et al. | |
| 2015/0043249 A1* | 2/2015 | Iorio | ..................... H03K 17/133 363/21.03 |
| 2015/0049522 A1* | 2/2015 | Iorio | .................. H02M 3/33576 363/21.03 |
| 2015/0049529 A1* | 2/2015 | Iorio | .................. H02M 3/33507 363/89 |
| 2016/0072376 A1* | 3/2016 | Ahlers | ................ H01L 27/0207 310/68 D |

* cited by examiner

*Primary Examiner* — Jeffrey Sterrett
(74) *Attorney, Agent, or Firm* — Seed IP Law Group PLLC (57) ABSTRACT

A control device controls a rectifier of a switching converter that is supplied with an input voltage and provides an output current. The rectifier is configured to rectify the output current of the converter and has at least one transistor. The control device, when the at least one transistor is turned off, provides a slow discharge path to ground in a normal operation condition and provides a fast discharge path to ground for discharging the control terminal of the at least one transistor in response to detecting a zero cross event of the current flowing through said at least one transistor.

20 Claims, 5 Drawing Sheets

CONTROL DEVICE FOR RECTIFIERS OF SWITCHING CONVERTERS

BACKGROUND

1. Technical Field

The present disclosure relates to a control device for rectifiers of switching converters.

2. Description of the Related Art

Resonant converters are a large class of forced switching converters characterized by the presence of a half-bridge or a full-bridge circuit. In the half-bridge version, for example, the switching elements comprise a high-side transistor and a low-side transistor connected in series between an input voltage and ground. A square wave having a high value corresponding to the power supply voltage and a low value corresponding to ground may be generated by conveniently switching the two transistors.

The square wave generated by the half-bridge is applied to the primary winding of a transformer by means of a resonant network which comprises at least one capacitor and one inductor. The secondary winding of the transformer is connected with a rectifier circuit and to a filter to provide an output direct voltage depending on the frequency of the square wave.

Figure 1:
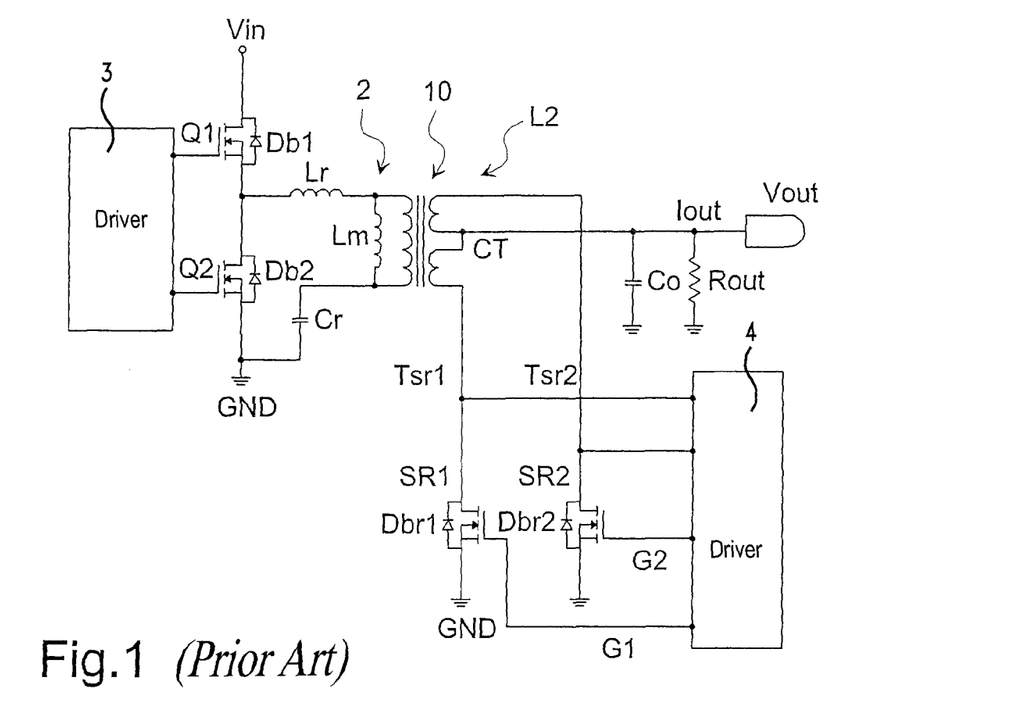
FIG. 1 is a diagram of an LLC-type resonant converter with a center-tapped secondary winding and full-wave rectification by means of synchronous rectifiers according to the known art.

At present, one of the resonant converters most widely used is the LLC resonant converter. This name derives from the fact that the resonant circuit employs two inductors (L) and a capacitor (C). A schematic circuit of an LLC resonant converter is shown in FIG. 1 and comprises a half-bridge of MOSFET transistors Q1 and Q2, with respective body diodes Db1 and Db2, between an input voltage Vin and ground GND and driving by a driver circuit 3. The common terminal between transistors Q1 and Q2 is connected to a resonant network 2 comprising a series of a first inductance Lr, a second inductance Lm and a capacitor Cr; the inductance Lm is connected i in parallel to a transformer 10 comprising a secondary winding L2. The last is normally connected to the parallel of a capacitor Co and a resistance Rout by means of the rectifier diodes.

These resonant converters are characterized by a high conversion efficiency (>95% is easily achievable), an ability to work at high frequencies, low generation of EMI (Electro-Magnetic Interference).

In current types of converter circuits, a high conversion efficiency and high power density are desired, as in the case, for example, of the AC-DC adaptors of notebooks. LLC resonant converters are at present the converters that best meet such desires.

However, the maximum efficiency achievable is limited by the losses in the rectifiers on the secondary side of the converter, which account for over 60% of total losses.

It is known that in order to significantly reduce the losses connected to secondary rectification, recourse can be made to the so-called "synchronous rectification" technique, in which rectifier diodes are replaced by power MOSFETs, with a suitably low on-resistance, such that the voltage drop across it is significantly lower than that across the diode; and they are driven in such a manner as to be functionally equivalent to the diode. This technique is widely adopted in traditional converters, especially in flyback and forward converters, for which there also exist commercially available dedicated integrated control circuits. There is an increasingly pressing desire to adopt this technique in resonant converters as well, in particular in LLC converters, in order to enhance their efficiency as much as possible.

FIG. 1 shows the converter wherein in the place of diodes there are two transistors SR1 and SR2, suitably driven by two signals G1 and G2 and connected between the terminals of the two parts of the center-tapped CT secondary winding connected to ground GND, while the parallel of Co and Rout is disposed between the center tap CT of the secondary winding L2 and ground GND. The output voltage Vout of the resonant converter is the voltage across said parallel, while the output current Io flows through the resistance Rout.

The transistors SR1 and SR2 have respective body diodes Dbr1 and Dbr2, and are both driven by a synchronous rectifier driver 4. The center-tap terminal of the secondary winding is then connected to the parallel of a capacitor Co and a resistance Rout. The output voltage Vout of the resonant converter is the voltage across said parallel, while the output current Io flows through the resistance Rout.

In operation, the transistors SR1 and SR2 are driven in such a manner to be alternatively turned-on by the synchronous rectifier driver 4. When the body diode Dbr1, Dbr2 of one of the transistors SR1, SR2 starts conducting the relative transistor is turned-on, while when the current is approaching to zero the transistor is turned-off; in this way the use of the transistors SR1, SR2 causes a lower voltage drop than the use of the rectifier diodes and the power dissipation is reduced.

Figure 2:
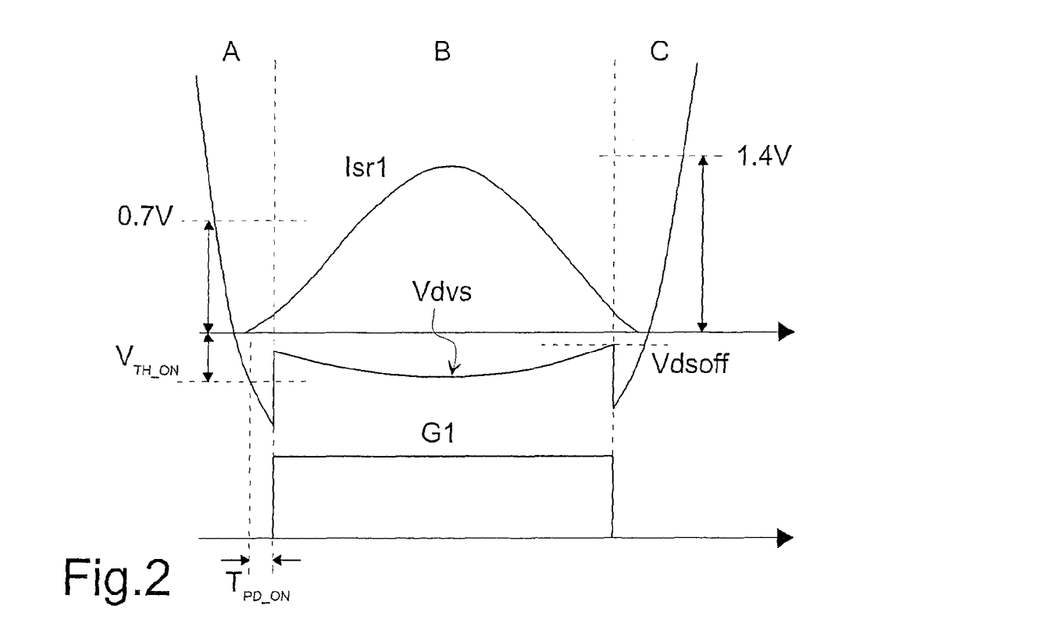
FIG. 2 shows the waveforms of the current flowing through a transistor of the rectifiers of FIG. 1 and of its drain source voltage.

Particularly, as is shown in FIG. 2, a phase A is activated when the voltage Vdvs between the drain and source terminals of one of the transistor SR1, SR2, for example SR1, is lower than a voltage value of 0.7V the relative body diode Dbr1 starts conducting; then when the voltage Vdvs falls under the on voltage threshold $V_{TH\_ON}$ and after a fixed delay time period $T_{PD\_ON}$, always if the voltage Vdvs is maintained under the on voltage threshold $V_{TH\_ON}$, the transistor SR1 is turned on from the driver by the signal G1.

After the turn on of the transistor SR1, in a phase B, the voltage Vdvs has a value of Vdvs=−Rdson×Isr1, wherein Rdson is the on resistance of the transistor SR1, SR2 and Isr1 is the current flowing through the electric path between the center-tap CT of the secondary winding L2 of the transformer, the transistor SR1 and ground GND.

When the voltage Vdvs has a value higher than a second voltage threshold Vdsoff, the transistor SR1 is turned off by the driver. The respective body diode Dbr1 conducts again and the voltage Vdsv goes negative; when the voltage Vdsv reaches the value of 1.4V, the drive circuit relative to the transistor SR2 is enabled.

However, the voltage Vdvs depends on parasitic elements of the source and drain terminals of the transistor SR1, SR2 and of the path on a printed circuit board (PCB) from the drain terminal of the transistor SR1, SR2 to the terminal of the secondary winding L2. Particularly, the voltage Vdsv depends on the parasitic inductances Lsource and Ldrain associated to the source and drain terminals of the transistor SR1, SR2 and on the parasitic inductance Ltrace relative to the path on the printed circuit board (PCB) from the drain terminal of the transistor SR1, SR2 to the terminal of the secondary winding, therefore, indicating with Isr the current Isr1 or Isr2, the voltage Vdvs equals as follows:

$$Vdvs = -Rdson \times Isr - (Ldrain + Lsource + Ltrace) \times \frac{\partial Isr}{\partial t},$$

that is the parasitic inductances make the sensed voltage Vdvs different from the ideal voltage drop value on Rdson.

The presence of the parasitic inductances Ldrain, Lsource and Ltrace determines an undesired earlier turn-off of the transistors SR1, SR2.

A known technique to avoid the earlier turn-off of the transistors SR1, SR2 is to compensate for the time advance due to the parasitic inductances by adding an RC filter. The RC filter comprises an external capacitor and a tunable resistor. Current inversion should be avoided to prevent converter malfunctions and failure.

The RC compensation of the parasitic inductances Ldrain, Lsource and Ltrace may cause a delay to turn on the transistors SR1, SR2; a bypass diode arranged in parallel to the tunable resistor eliminates this turn-on time delay. Furthermore, a resistor, of the value of about 100-200Ω, arranged in series to the bypass diode is typically used to limit current out of the drain terminal of the transistors SR1, SR2, in the case wherein the voltage Vdvs goes excessively under ground GND.

This solution has the advantages of providing a simple architecture with a consequent low cost in term of silicon area and good performance.

Figure 3:
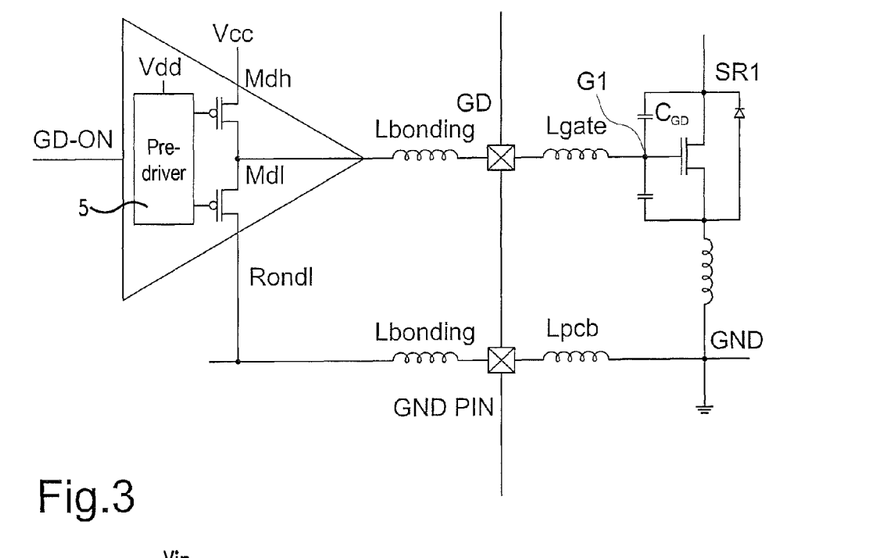
FIG. 3 is a diagram of a transistor of the rectifiers of FIG. 1 with its control device and the parasitic elements.

The driver 4 of the transistors SR1, SR2 provides a discharge path to ground GND for the gate terminals G1, G2 of the transistors SR1, SR2. For example, the prior art driver 4 allows the discharge of the gate terminal G1 through a discharge path comprising a low side transistor Mdl (an NMOS transistor) of a half-bridge the high side transistor Mdh (a PMOS transistor) of which is connected to the supply voltage Vcc (as shown in FIG. 3. Both the transistors Mdh, Mdl are driven by a pre-driver 5 connected to an internal supply voltage Vdd and having at the input the signal GD-ON. The transistor Mdl is turned on fast to allow a fast turn off of the transistor SR1 in order to avoid inversion current problems.

However, the on resistance Rondl of the low side transistor Mdl in combination with the parasitic gate-drain capacitance CGD of the MOS transistor SR1 and the parasitic inductances (the parasitic inductances Lbonding between the pin GD and the driver 4 and between the driver 4 and ground pin GND PIN, the inductance Lpcb from the ground pin GND PIN and the ground plane GND of the printed circuit board wherein the transistors SR1, SR2 are implemented, and the inductance Lgate between the pin GD and the gate terminal G1 of the MOS transistor SR1) form a high level of noise on internal ground plane GND and on the internal supply voltage Vdd, that is the ground and supply voltage nodes inside the integrated circuit wherein the control device 4 is implemented, due to the discharge path from the drain terminal of the MOS transistor SR1, SR2 to ground GND.

Also the parasitic gate-drain capacitance CGD of the MOS transistor SR1, SR2 form a current spike in the discharge path from the drain terminal of the MOS transistor SR1, SR2 to ground GND through the transistor Mdl.

BRIEF SUMMARY

One aspect of the present disclosure provides a control device for rectifiers of switching converters which reduces the noise on internal node of ground and on internal node of the supply voltage.

One aspect of the present disclosure is a control device for a rectifier of a switching converter, said converter being supplied with an input voltage and being adapted to provide an output current, said rectifier being configured to rectify the output current of the converter and having at least one transistor, wherein the control device, when said at least one transistor is turned off, provides a slow discharge path to ground or a fast discharge path to ground for discharging the drivable terminal of said at least one transistor in response to respectively a normal operation condition or a zero cross event of the current flowing through said at least one transistor.

BRIEF DESCRIPTION OF THE SEVERAL VIEWS OF THE DRAWINGS

For a better understanding of the present disclosure, a preferred embodiment thereof is now described, purely by way of non-limiting example and with reference to the annexed drawings, wherein.

DETAILED DESCRIPTION

Figure 4:
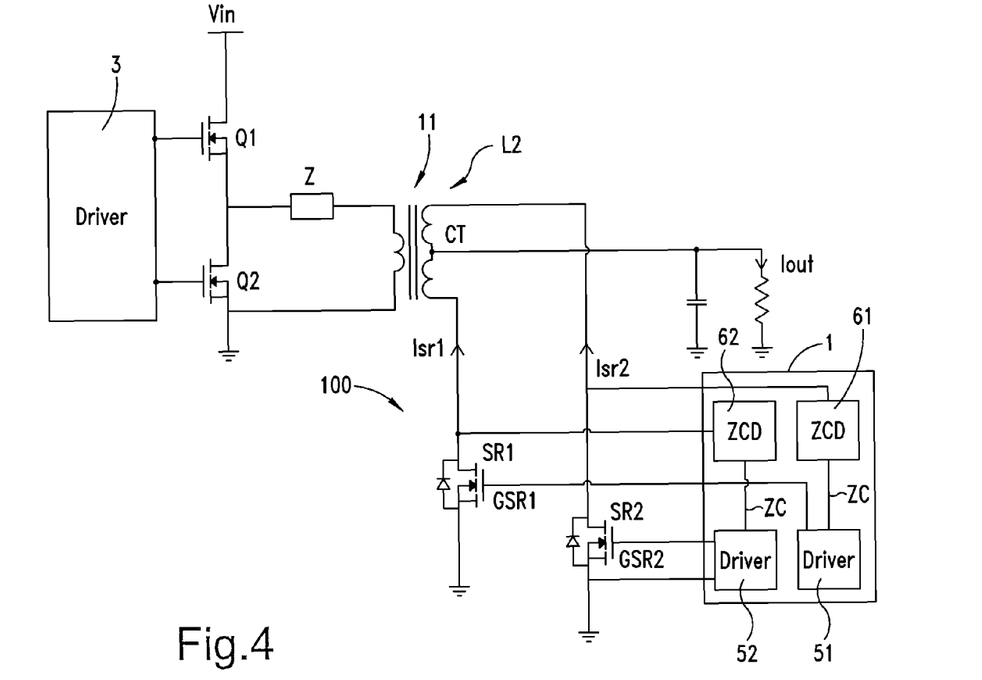
FIG. 4 is a diagram of a switching converter comprising a control device for a rectifier according to the present disclosure.

A control device 1 for a rectifier 100 of a switching converter according to the present disclosure is shown in FIG. 4. The converter is supplied with an input voltage Vin, comprises preferably a half-bridge Q1, Q2, an impedance Z connected to the primary winding of a transformer 11 and a center tap secondary winding L2. The converter is adapted to provide an output current Iout and the rectifier 100 is adapted to rectify the output current Iout of the converter and comprises at least one transistor SR1, SR2, preferably at least one MOS transistor and preferably two transistors SR1, SR2. Preferably the switching converter is a resonant converter and the impedance Z is a resonant network. The transistors SR1, SR2 of the rectifier 100 are connected between the terminals of a center-tap secondary winding L2 of the transformer 11 and ground. The control device 1 of rectifier 100 is connected with the control terminal of the at least one transistor SR1, SR2, that is the gate terminal of the MOS transistor, preferably with the control terminals GSR1 and GSR2 of both the transistors SR1 and SR2. Preferably the control device 1 comprises a drivers 51, 52 for driving respectively the transistors SR1 and SR2 and respective zero-cross detecting circuits (ZCD) 61, 62 configured to respectively detect the currents Isr1 and Isr2 crossing zero.

Figure 5:
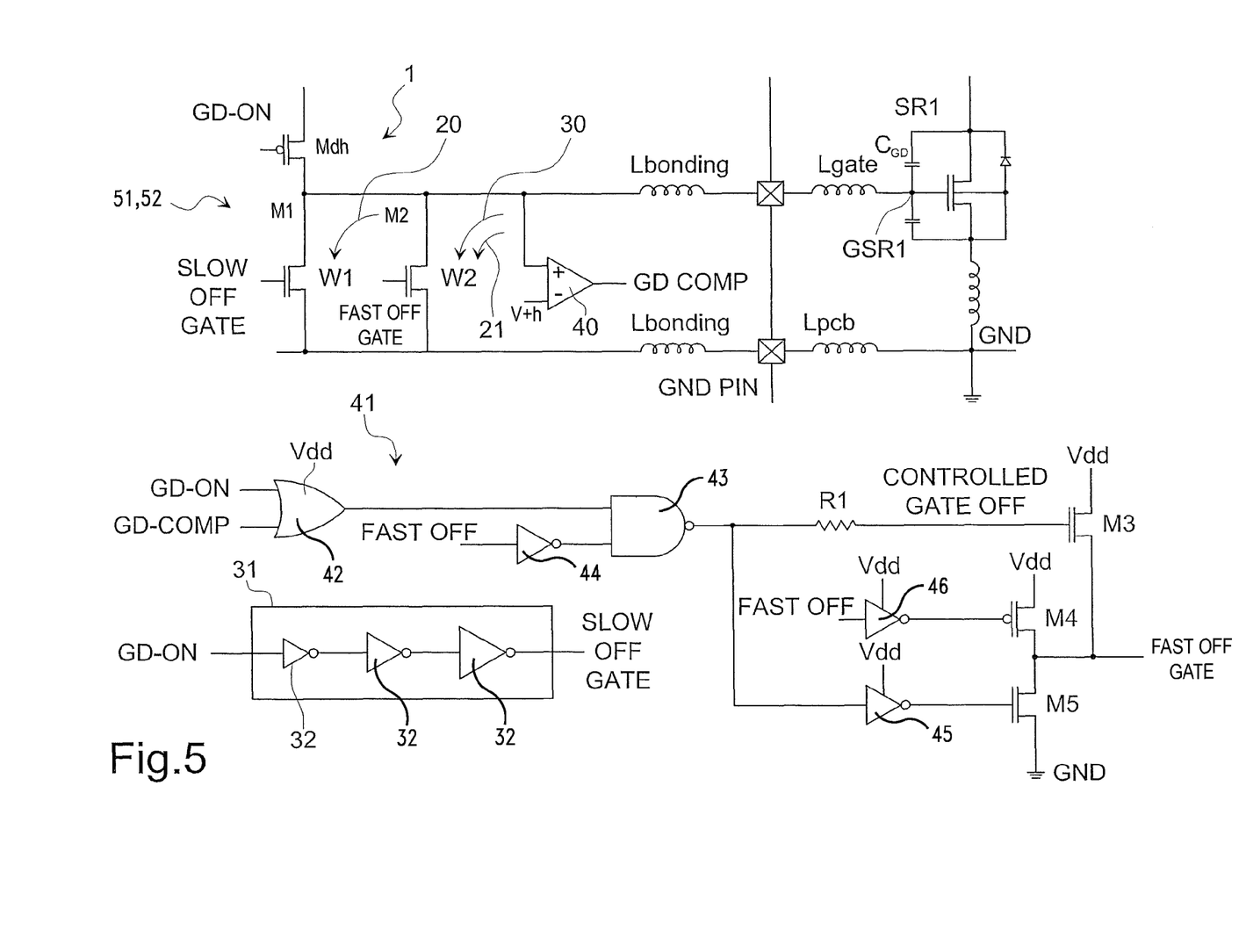
FIG. 5 is a more detailed diagram of a control device for a rectifier of a switching converter according to the present disclosure.

Each one of the drivers 51, 52 comprises a slow discharge path 20 to ground GND and a fast discharge path 30 to ground GND for the control terminal GSR1, GSR2 of the transistor SR1, SR2 of the rectifier 100, as shown in FIG. 5. The slow discharge path 20 is enabled in normal operation condition, that is when the current Isr1, Isr2 flowing through the at least one transistor SR1, SR2 does not cross zero GND, while the fast discharge path 30 is enabled in the case of a zero cross of the current Isr1, Isr2. The control device 1 uses the slow discharge path 20 to ground GND or the fast discharge path 30 to ground GND for the control terminal GSR1 or GSR2 when the respective transistor SR1 or SR2 is turned off, that is when the signal GD-ON for turning on one of the transistors SR1 or SR2 goes from the high logic level to the low logic level. The control device 1 provides to turn on and off the transistors SR1 and SR2 alternately.

The circuit configuration of the driver 51 is equal to the circuit configuration of the driver 52; for this reason only the driver 51 will be described more in detail.

The driver 51 comprises a half-bridge formed by a high side transistor Mdh (a PMOS transistor) which is connected to the supply voltage Vcc and two low side transistors M1, M2 (both NMOS transistors) connected to the ground plane GND of the transistor SR1. The transistor M2 has a greater dimension than the transistor M1, that is the width W2 of the transistor M2 is greater than the width W1 of the transistor M1 and therefore the on resistance of the transistor M1 is greater than the on resistance of the transistor M2.

The high side transistor Mdh is driven by the signal GD-ON while the low side transistors M1, M2 are respectively driven by the signals SLOW OFF GATE and FAST OFF GATE which derive from the driver 51.

The driver 51 will send the signal SLOW OFF GATE to the transistor M1 in normal operation condition to turn it on and to assure a slow discharge of the control terminal GSR1 of the transistor SR1 to ground GND by means of the slow discharge path 20. The signal SLOW OFF GATE assures a low discharge of the control terminal GSR1 through the high on resistance transistor M1; the signal SLOW OFF GATE may preferably be a ramp signal, preferably a ramp voltage from ground GND to the supply voltage Vdd for limiting the noise on the internal node of supply voltage Vdd. In this way the noise on the ground plane GND, which is due to the parasitic elements, particularly the parasitic inductances (the parasitic inductances Lbonding between the terminal GSR1 and the driver 51 and between the driver 51 and ground pin GND PIN, the inductance Lpcb from the ground pin GND PIN and the ground plane GND of the printed circuit board wherein the transistors SR1, SR2 are implemented, and the inductance Lgate of the gate terminal of the MOS transistor SR1), is reduced.

The control 51 will send the signal FAST OFF GATE to the transistor M2 to turn on it when a zero cross event of the current Isr1 occurs (which is detected by the detecting circuit 61) to assure a fast discharge of the control terminal GSR1 of the transistor to ground GND by means of the fast discharge path 30. The signal FAST OFF GATE assures a fast discharge of the control terminal GSR1 through a low on resistance transistor; the signal FAST OFF GATE may be a pulse signal with a square wave shape having a duration such as to assure the discharge of the control terminal GSR1

The control device portion 51 provides to turn on and off the transistors M1, M2 to assure the low discharge path 20 and/or the fast discharge path 30.

Preferably, in normal operation condition, when the voltage GATE DRIVE between the gate terminal GSR1 and ground GND falls under the voltage threshold Vth of the MOS transistor SR1, that is the on threshold of the MOS transistor SR1 which typically is of 4.5 V, the transistor M1 is maintained on by the signal SLOW OFF GATE and the transistor M2 is turned on by the FAST OFF GATE signal under control of a signal CONTROLLED GATE OFF which preferably is a controlled slope ramp voltage which goes from ground GND to the supply voltage Vdd. In this way a low resistance path 21 to ground GND is assured by the transistor M2 for reducing the voltage peak at the gate terminal GSR1 which is due to the current peak IpeakM1 of the current flowing through the transistor M1 in turn due to the current Ic deriving from the drain terminal of the MOS transistor SR1 by means of the gate-drain parasitic capacitance CGD, that is $$Ic = CGD \times \frac{dVdvs}{dt}.$$

The current peak due to the current Ic is formed during the voltage transition from a low level to a high level of the drain-source voltage which occurs after the turn off of the transistor SR1. Preferably the signal CONTROLLED GATE OFF is a controlled slope ramp to limit the current peak Ipeak M2 on the current flowing through the transistor M2. When both the transistors M1 and M2 are turned on the discharge of the drivable terminal GSR1 will occur through both the transistors M1 and M2 but the greater portion of the discharge will occur through the transistor M2 which has an on resistance less than that of the transistor M1.

The time period Trise wherein the ramp of the signal CONTROLLED GATE OFF goes from ground GND to the maximum voltage value (the supply voltage Vdd) should be less than the time period Tdiode, that is the time period from the instant wherein the voltage GATE DRIVE falls under the voltage threshold Vth until the time instant of a zero-cross ZC of the current Isr1; in this way, with Tdiode greater than Trise, the transistor M2 is completely turned on before the zero-cross ZC of the current Isr1.

The signal SLOW OFF GATE may be produced by means of circuit 31 comprising a plurality of NOT gates 32, particularly an odd number of NOT gates. The signal at the input of the circuit 31 is the signal GD-ON and the signal at the output is the signal SLOW OFF GATE.

A comparator 40 is used to compare the voltage GATE DRIVE and the voltage threshold Vth; the output of the comparator is a signal GD-COMP which is at the low logic level when the voltage GATE DRIVE falls under the voltage threshold Vth.

A drive circuit 41 provides to drive the transistor M2. The circuit 41 comprises an OR gate 42 having at the inputs the signals GD-ON and GD-COMP and an output that provides an output signal to a first input of a NAND gate 43 having a second input that receives an output signal of a NOT gate 44 having at the input a signal FAST OFF. The signal FAST OFF goes to a high logic level in response to the zero crossing signal ZC going to the high logic level when the zero crossing detector 61 detects a zero crossing of the current Isr. The output signal of the NAND gate 43 is sent by means of a resistance R1 to the gate terminal of an NMOS M3 by forming the signal CONTROLLED GATE OFF. The transistor M3 has the drain terminal connected with the supply voltage Vcc and the source terminal connected with the gate terminal of the transistor M2.

The output signal of the NAND gate 43 is sent to a NOT gate 45 which provides an inverted version of the output signal of the NAND gate 43 to the gate terminal of a NMOS transistor M5 having a source terminal connected to ground GND and a drain terminal connected to the drain terminal of the transistor M3 and the gate terminal of the transistor M2. The drive circuit 41 also includes PMOS transistor M4 having a source terminal connected to an internal supply voltage Vdd, that is a supply voltage node inside the integrated circuit wherein the control device 1 is implemented, a drain terminal connected to the drains of the transistors M3, M5, and a gate terminal that receives the output signal of a NOT gate 46 having at the input the signal FAST OFF.

When the zero-cross detecting circuit 61 detects a zero cross ZC of the current Isr1, the signal FAST OFF goes to the high logic level which causes the NOT gate 46 to turn on the PMOS transistor M4 which connects the gate terminal of the transistor M2 with the supply voltage Vdd and causes the transistor M2 to turn on and quickly discharge the gate of the transistor SR1. When there is not a zero cross event of the current Isr1, the signal FAST OFF is at the low logic level (that is at ground GND) which causes the NOT gate 44 to output a high logic level to the second input of the NAND gate 43. If the signal GD-COMP is also at low logic level, then the OR gate 42 output goes to the low logic level which cause the output of the NAND gate 43 to go to the high logic level. This causes the signal CONTROLLED GATE OFF, which is formed by means of the resistance R1 and the capacitance Cgs between the gate and source terminals of the transistor MOS M3, to have a controlled slope ramp from ground to the supply voltage Vdd and the slope of the ramp is controlled by the product of the resistance R1 by the capacitance Cgs between the gate and source terminals of the transistor MOS M3. Therefore, to enable the voltage ramp of the signal CONTROLLED GATE OFF to rise from the low level GND to the supply voltage Vdd in a time period Trise, the value of the resistance R1 is chosen consequently.

The signal CONTROLLED GATE OFF turns on the transistor M3 which connects the gate terminal of the transistor M2 with a voltage Vdd-Vthm3 wherein Vthm3 is the voltage threshold of the transistor M3; in this way a low noise of the internal node of supply voltage Vdd is reduced.

Figure 6:
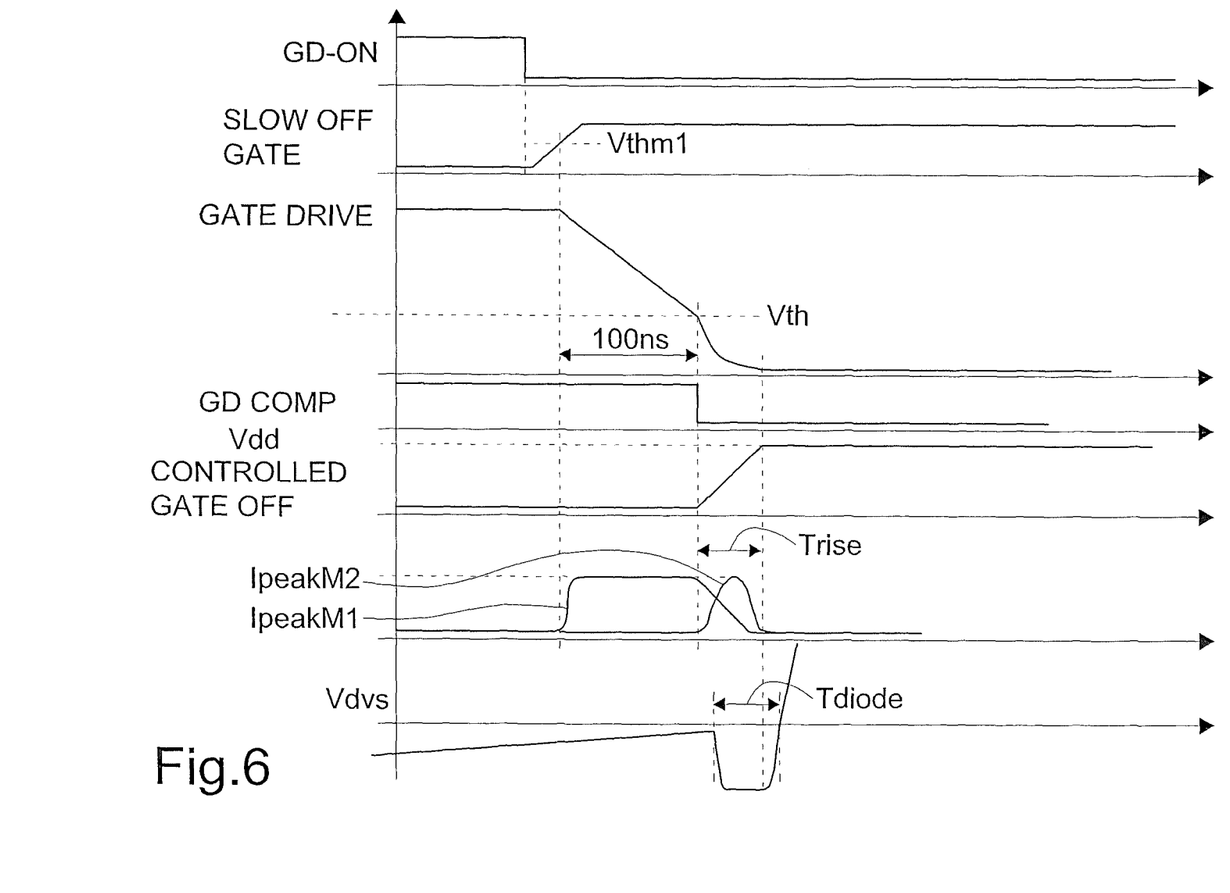
FIG. 6 shows the waveforms of voltages and current in play in the control device and the rectifier of FIG. 5 during normal operation condition.

FIG. 6 shows the waveforms of the signals GD-ON, SLOW OFF GATE, GATE DRIVE, GD-COMP, CONTROLLED GATE OFF, Vdvs and the signals IpeakM2, IpeakM1 which are the peaks of the currents flowing through the transistors M1 and M2, in normal operation condition. When the signal GD-ON is at the low logic level and the signal SLOW OFF GATE rises to the high logic level (the voltage Vdd) and overcomes the voltage threshold Vthm1 of the transistor M1 the voltage GATE DRIVE starts its slope to ground GND. When the voltage GATE DRIVE falls under the voltage threshold Vth, the output signal GD-COMP of the comparator 40 is at low logic level, the voltage CONTROLLED GATE OFF rises from ground GND to Vdd in a time period Trise which is smaller than the time period Tdiode. The time period wherein the voltage GATE DRIVE falls from Vcc to the voltage threshold Vth is, for example, of 100 nanoseconds.

Figure 7:
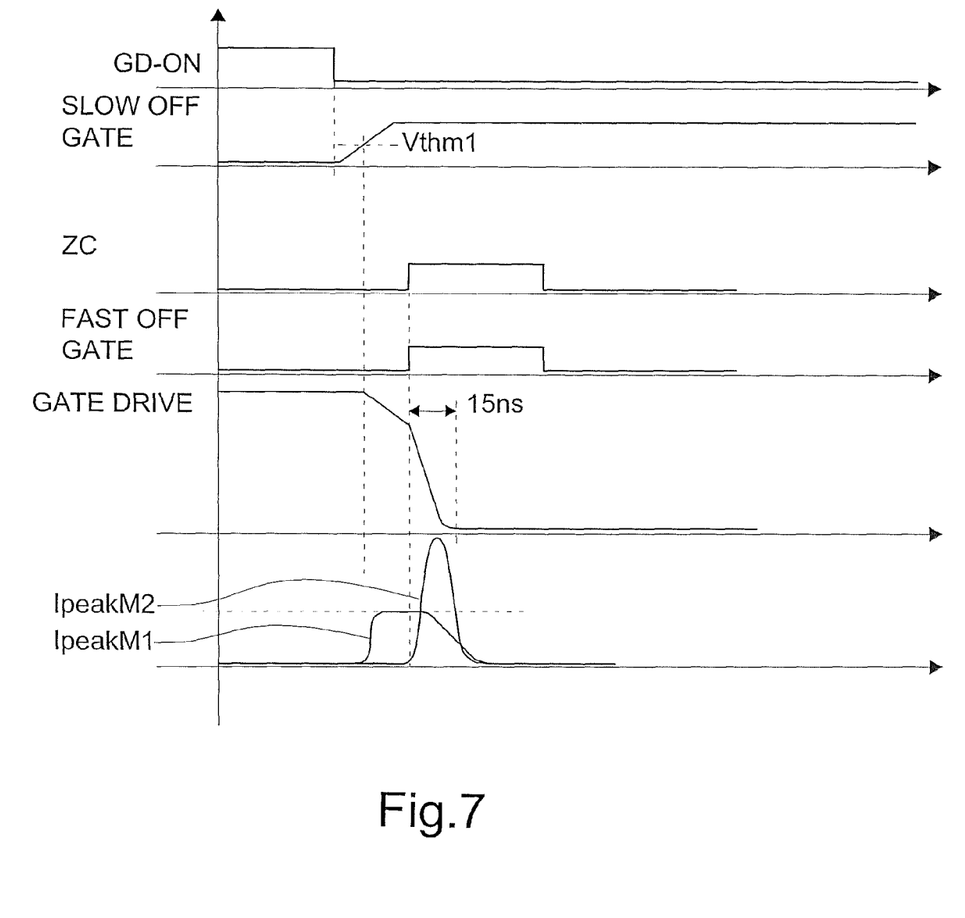
FIG. 7 shows the waveforms of voltages and current in play in the control device and the rectifier of FIG. 5 in the case of inversion of the current flowing through one transistor of the rectifier in FIG. 5.

FIG. 7 shows the waveforms of the signals GD-ON, SLOW OFF GATE, GATE DRIVE, ZC, FAST OFF GATE and the signals IpeakM2, IpeakM1 which are the peaks of the currents flowing through the transistors M1 and M2, in the case of inversion of the current Isr1. When the signal GD-ON is at the low logic level and the signal SLOW OFF GATE rises to the high logic level (the voltage Vcc) and overcomes the voltage threshold Vthm1 of the transistor M1 the voltage GATE DRIVE starts its slope to ground GND. When a zero-cross of the current Isr1 flowing the transistor SR1 is detected by the detecting circuit 61, a pulse ZC is at the output of the detecting circuit 61, the voltage FAST OFF GATE rises fast to the high logic level and the voltage GATE DRIVE falls fast to ground in a time period of, for example, 15 nanoseconds.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control device for a rectifier of a switching converter, said control device comprising:
    a zero crossing detector configured to detect a zero crossing of a current through a rectifier transistor of the rectifier and output a zero crossing signal indicating a detection of the zero crossing;
    a selectable slow discharge path configured to discharge a control terminal of the rectifier transistor to ground;
    a selectable fast discharge path configured to discharge the control terminal of the rectifier transistor to ground more quickly than the slow discharge path; and
    a controller configured to enable the slow discharge path to discharge the control terminal of the rectifier transistor in a normal operation condition and enable the fast discharge path to discharge the control terminal of the rectifier transistor in response to the zero crossing signal indicating the zero crossing of the current through said rectifier transistor.

2. The control device according to claim 1, wherein the controller is configured to enable the second discharge path in response to detecting that a voltage at the control terminal of the rectifier transistor is lower than a voltage threshold when in the normal operation condition.

3. The control device according to claim 1, wherein:
    said slow discharge path and said fast discharge path respectively comprise a first switch and a second switch configured to be arranged between the control terminal of said rectifier transistor and ground;
    the second switch has a greater channel width than the first switch; and
    said controller is configured to close said first switch and open said second switch in the normal operation condition and to close said second switch in response to the zero crossing signal indicating the zero crossing of the current through said rectifier transistor.

4. The control device according to claim 3, wherein the controller includes:
    a detector configured to detect that a voltage at the control terminal of the rectifier transistor is lower than a voltage threshold when in the normal operation condition;
    a delay circuit configured to produce a ramp signal in response to receiving from the detector a detection signal indicating that the voltage at the control terminal of the rectifier transistor is lower than the voltage threshold; and
    a third switch configured to close said second switch, while the first switch remains closed, in response to the ramp signal.

5. The control device according to claim 4, wherein the delay circuit is configured to produce said ramp signal with a ramp that goes from ground to a maximum voltage value in a time period that is less than a time period from an instant in which the voltage at the control terminal of the rectifier transistor falls under said voltage threshold until a time instant of the zero crossing of the current through said rectifier transistor.

6. The control device according to claim 4, wherein:
the control device is an integrated circuit and includes a supply voltage internal node
the third switch is an N-channel MOSFET transistor having a source terminal coupled to a control terminal of said second switch, a drain terminal coupled to the supply voltage internal node, and a gate terminal configured to be driven by the ramp signal.

7. The control device according to claim 3, wherein controller is configured to drive said first switch of said slow discharge path with a ramp signal that goes from ground to a maximum voltage value.

8. The control device according to claim 1, comprising a comparator configured to compare a voltage at the control terminal with a voltage threshold, wherein the controller is configured to enable the second discharge path in response to the comparator detecting that a voltage at the control terminal of the rectifier transistor is lower than a voltage threshold when in the normal operation condition.

9. A switching resonant converter, comprising:
a transformer configured to provide an output current of the converter, said transformer including a primary winding and a secondary winding;
a rectifier coupled to the secondary winding and configured to rectify said output current of the converter, said rectifier including a rectifier transistor; and
a control device configured to control the rectifier and including:
a zero crossing detector configured to detect a zero crossing of a current through the rectifier transistor and output a zero crossing signal indicating a detection of the zero crossing;
a selectable slow discharge path configured to discharge a control terminal of the rectifier transistor to ground;
a selectable fast discharge path configured to discharge the control terminal of the rectifier transistor to ground more quickly than the slow discharge path; and
a controller configured to enable the slow discharge path to discharge the control terminal of the rectifier transistor in a normal operation condition and enable the fast discharge path to discharge the control terminal of the rectifier transistor in response to the zero crossing signal indicating the zero crossing of the current through said rectifier transistor.

10. The switching resonant converter according to claim 9, wherein the controller is configured to enable the second discharge path in response to detecting that a voltage at the control terminal of the rectifier transistor is lower than a voltage threshold when in the normal operation condition.

11. The switching resonant converter according to claim 9, wherein:
said slow discharge path and said fast discharge path respectively comprise a first switch and a second switch configured to be arranged between the control terminal of said rectifier transistor and ground;
the second switch has a greater channel width than the first switch; and
said controller is configured to close said first switch and open said second switch in the normal operation condition and to close said second switch in response to the zero crossing signal indicating the zero crossing of the current through said rectifier transistor.

12. The switching resonant converter according to claim 11, wherein the controller includes:
a detector configured to detect that a voltage at the control terminal of the rectifier transistor is lower than a voltage threshold when in the normal operation condition;
a delay circuit configured to produce a ramp signal in response to receiving from the detector a detection signal indicating that the voltage at the control terminal of the rectifier transistor is lower than the voltage threshold; and
a third switch configured to close said second switch, while the first switch remains closed, in response to the ramp signal.

13. The switching resonant converter according to claim 12, wherein the delay circuit is configured to produce said ramp signal with a ramp that goes from ground to a maximum voltage value in a time period that is less than a time period from an instant in which the voltage at the control terminal of the rectifier transistor falls under said voltage threshold until a time instant of the zero crossing of the current through said rectifier transistor.

14. The switching resonant converter according to claim 12, wherein:
the control device is an integrated circuit and includes a supply voltage internal node
the third switch is an N-channel MOSFET transistor having a source terminal coupled to a control terminal of said second switch, a drain terminal coupled to the supply voltage internal node, and a gate terminal configured to be driven by the ramp signal.

15. The switching resonant converter according to claim 11, wherein controller is configured to drive said first switch of said slow discharge path with a ramp signal that goes from ground to a maximum voltage value.

16. The switching resonant converter according to claim 9, wherein the control device includes a comparator configured to compare a voltage at the control terminal with a voltage threshold, wherein the controller is configured to enable the second discharge path in response to the comparator detecting that a voltage at the control terminal of the rectifier transistor is lower than a voltage threshold when in the normal operation condition.

17. A control method, comprising:
controlling a rectifier of a switching converter that is configured to provide an output current based on an input voltage, said rectifier being configured to rectify the output current of the converter and having a rectifier transistor, the controlling including:
providing a slow discharge path from a control terminal of the rectifier transistor to ground in a normal operation condition when the rectifier transistor is turned off;
detecting a zero crossing of a current through the rectifier transistor; and
providing a fast discharge path from the control terminal of the rectifier transistor to ground in response to detecting the zero crossing of the current through said rectifier transistor, the fast discharge path discharging the control terminal more quickly than the slow discharge path.

18. The method of claim 17, comprising:
detecting that a voltage at the control terminal of the rectifier transistor is lower than a voltage threshold when in the normal operation condition; and enabling the second discharge path in response to detecting that the voltage at the control terminal of the rectifier transistor is lower than the voltage threshold.

19. The method of claim 18, wherein:

said slow discharge path and said fast discharge path respectively comprise a first switch and a second switch arranged between the control terminal of said rectifier transistor and ground;

the second switch has a greater channel width than the first switch; and providing the slow discharge path includes closing said first switch and opening said second switch in the normal operation condition; and providing the fast discharge path includes closing said second switch in response to the zero crossing signal indicating the zero crossing of the current through said rectifier transistor.

20. The method of claim 19, comprising:

detecting that a voltage at the control terminal of the rectifier transistor is lower than a voltage threshold when in the normal operation condition;

producing a ramp signal in response to detecting that the voltage at the control terminal of the rectifier transistor is lower than the voltage threshold; and closing said second switch, while the first switch remains closed, in response to the ramp signal.

* * * * *